US007805648B2

(12) United States Patent
Ramachandran (10) Patent No.: US 7,805,648 B2
(45) Date of Patent: Sep. 28, 2010

(54) SHIFT-FREQUENCY SCALING

(75) Inventor: Aditya Ramachandran, Bangalore (IN)

(73) Assignee: Open-Silicon Inc., Milpitas, CA (US)

( * ) Notice: Subject to any disclaimer, the term of this patent is extended or adjusted under 35 U.S.C. 154(b) by 368 days.

(21) Appl. No.: 12/080,878

(22) Filed: Apr. 7, 2008

(65) Prior Publication Data

US 2009/0254787 A1    Oct. 8, 2009

(51) Int. Cl.
*G01R 31/28* (2006.01)
(52) U.S. Cl. .................. 714/731; 714/726; 714/744
(58) Field of Classification Search ............. 714/726, 714/731, 740, 744, 30
See application file for complete search history.

(56) References Cited

U.S. PATENT DOCUMENTS

| 3,806,891 | A | 4/1974 | Eichelberger et al. ..... 340/172.5 |
|---|---|---|---|
| 4,493,077 | A | 1/1985 | Agrawal et al. ............... 371/25 |
| 4,534,028 | A | 8/1985 | Trischler ..................... 371/25 |
| 4,601,032 | A | 7/1986 | Robinson ..................... 371/23 |
| 4,947,397 | A | 8/1990 | Sobel et al. ................ 371/16.4 |
| 5,550,841 | A | 8/1996 | O'Brien ..................... 371/22.1 |
| 5,592,493 | A | 1/1997 | Crouch et al. .............. 371/22.3 |
| 5,668,732 | A | 9/1997 | Khouja et al. ............... 364/483 |
| 5,696,694 | A | 12/1997 | Khouja et al. ............... 364/488 |
| 5,717,702 | A | 2/1998 | Stokes et al. ............. 371/22.35 |
| 5,862,149 | A | 1/1999 | Carpenter et al. .......... 371/22.3 |
| 6,014,763 | A | 1/2000 | Dhong et al. ............... 714/724 |
| 6,114,892 | A | 9/2000 | Jin ............................. 327/202 |
| 6,378,093 | B1 * | 4/2002 | Whetsel ...................... 714/726 |
| 6,708,305 | B1 | 3/2004 | Farnsworth et al. ......... 714/739 |
| 7,124,342 | B2 | 10/2006 | Wang et al. ................. 714/741 |
| 7,155,646 | B2 * | 12/2006 | Whetsel ...................... 714/726 |
| 7,155,650 | B2 * | 12/2006 | Whetsel ...................... 714/726 |
| 7,310,754 | B2 * | 12/2007 | Nishida et al. ............. 714/724 |
| 7,657,811 | B2 * | 2/2010 | Whetsel ...................... 714/729 |
| 2007/0089003 | A1 * | 4/2007 | Whetsel ...................... 714/726 |

OTHER PUBLICATIONS

Michael Bushnell and Vishwani Agrawal, "Essentials of Electronic Testing for Digital, Memory and Mixed-Signal VLSI Circuits", Kluwer Academic Publishers, ISBN 0792379918, 2002, pp. 60-69.

(Continued)

*Primary Examiner*—Phung M Chung
(74) *Attorney, Agent, or Firm*—Ohlandt, Greeley, Ruggiero & Perle, L.L.P.

(57) ABSTRACT

There is provided a method that includes, (a) determining a first clock frequency for shifting a first section of a scan pattern set through a path in a digital circuit such that a first power dissipated by the digital circuit while shifting the first section does not exceed a power limit, (b) determining a second clock frequency for shifting a second section of the scan pattern set through the path such that a second power dissipated by the digital circuit while shifting the second section does not exceed the power limit, (c) shifting the first section through the path at the first clock frequency, and (d) shifting the second section through the path at the second clock frequency, where first and second clock frequencies are different from one another. There is also provided a system that performs the method.

21 Claims, 8 Drawing Sheets

OTHER PUBLICATIONS

K.M. Butler et. al, "Minimizing power consumption in scan testing: pattern generation and DFT techniques", in Proc. International Test Conf. (ITC'04), pp. 355-364, 2004.

R.M. Chou, Kewal K. Saluja and Vishwani D. Agarwal, "Scheduling tests for VLSI systems under power constraints", IEEE Trans. VLSI, vol. 5, Issue 2, pp. 175-185, 1997.

S. Ghosh, S. Basu, and N. A. Touba, "Joint Minimization of Power and Area in Scan Testing by Scan Cell Reordering," Proc. IEEE Annual Symp. on VLSI, 2003, pp. 246-249.

I. Hamzaoglu and J. Patel, "Reducing test application time for full scan embedded cores", IEEE International Symposium on Fault Tolerant Computing, pp. 260-267, 1999.

Bellaouar, A. (Abdellatif); "Low-Power Digital VLSI Design: Circuits and Systems", Springer, ISBN 0792395875, 1995, pp. 129-138.

K. Skadron, M. Stan, W. Huang, S. Velusamy, K. Sankaranarayanan, and D. Tarjan, "Temperature-aware microarchitecture", International Symposium on Computer Architecture (ISCA), pp. 2-13, 2003.

Tafaj, E.; Rosinger, P.; Al-Hashimi, B.M.; Chakrabarty, K., "Improving thermal-safe test scheduling for core-based systems-on-chip using shift frequency scaling", Proc. IEEE Symposium on Defect and Fault Tolerance in VLSI Systems, vol. 0, pp. 544-551.

S. Wang and S. K. Gupta, "ATPG for heat dissipation minimization during scan testing," Proc. ACM/IEEE Design Automation Conf., 1997, pp. 614-619.

\* cited by examiner

SHIFT-FREQUENCY SCALING

BACKGROUND OF THE INVENTION

1. Field of the Invention

The present invention generally relates to the field of electronic design automation (EDA), and more specifically, to a shifting of scan patterns for testing a digital circuit.

2. Description of the Related Art

One method of testing semiconductor devices for defects is done by applying test patterns to primary inputs of the device and comparing values of the device's primary outputs against expected values.

Figure 1:
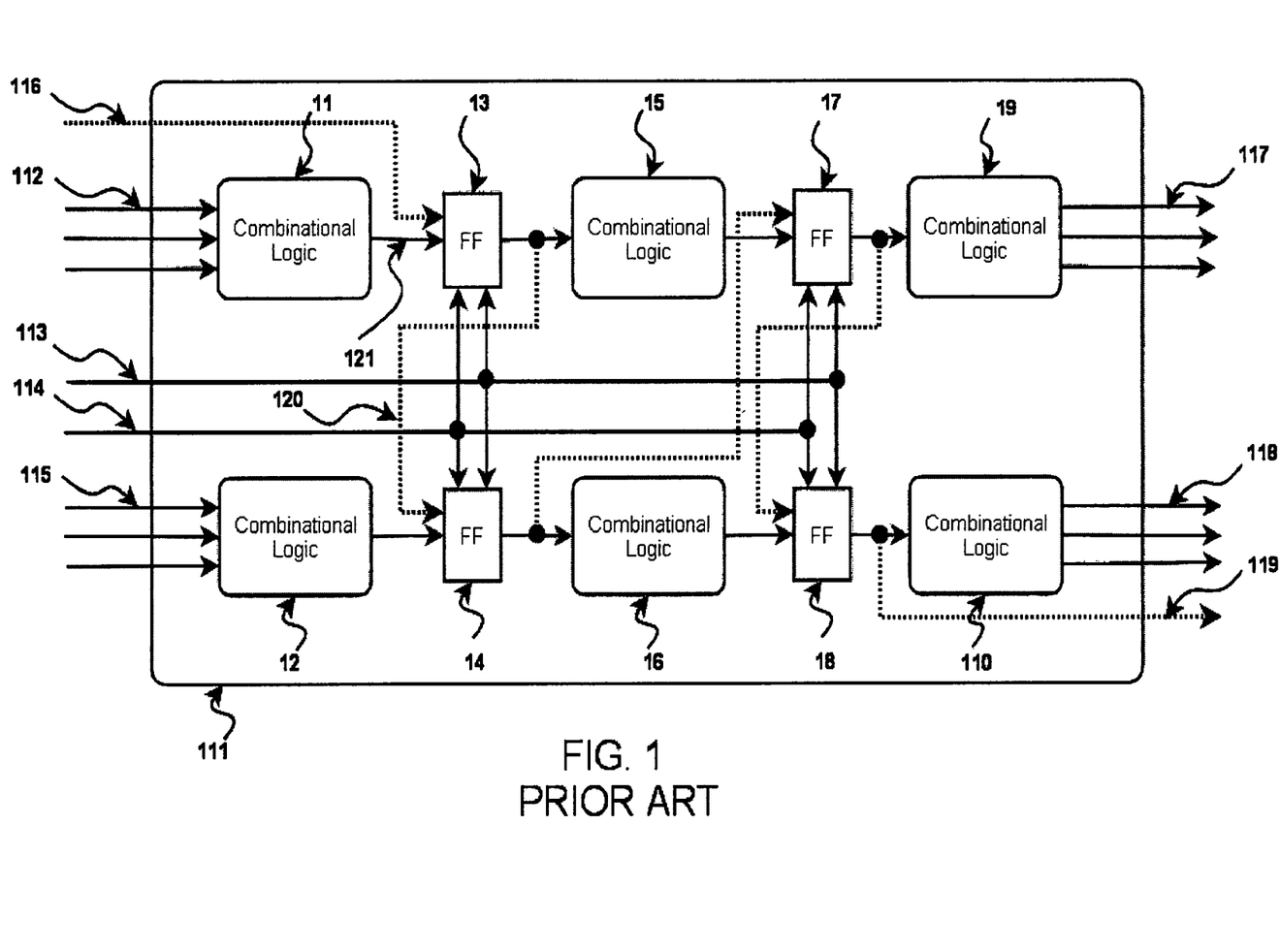
FIG. 1 is a block diagram of a generalized digital semiconductor device.

FIG. 1 is a block diagram of a generalized digital semiconductor device 111. Device 111 includes combinational logic blocks 11, 12, 15, 16, 19 and 110, and several flip-flops 13, 14, 17 and 18. Functional inputs such as 112 and functional outputs such as 117 provide an interface to the external world. Flip-flops 13, 14, 17 and 18 are all synchronized to sample values at their inputs on an edge of an input clock 113. Those skilled in the art will appreciate that device 111 is a greatly simplified representation of a digital integrated circuit, since there are many more combinational logic blocks, flops, clock inputs, functional inputs and functional outputs in a typical digital integrated circuit. Nevertheless, the representation of device 111 in FIG. 1 is adequate for the understanding of how the testing of an integrated circuit, or portions thereof, can be performed.

The testing of device 111 using only functional inputs is difficult. For example, a defect causing faulty operation of combinational logic block 11 cannot be directly observed at the output of device 111. A faulty value must first be captured in flip-flop 13. Then, the faulty value held in flip-flop 13 must cause a faulty output from combinational block 15, which would be captured in flip-flop 17. Then, the faulty value held in flip-flop 17 must cause a faulty output from combinational block 19, which can be observed on functional outputs 117.

A pattern exercising only functional inputs and outputs must not only be able to propagate a defective value through many stages of combinational logic and flops, but must also be able to pinpoint the location of the defect based on the sampled value on the functional outputs. A reason for the difficulty in using only functional inputs and outputs for test is that there is no easy way to control the inputs to the internal combinational blocks, or to observe the outputs of the combinational blocks. Scan architectures are used to make the process of testing semiconductor devices easier by reusing the internal flops of the device as virtual inputs and outputs to the combinational logic blocks (see U.S. Pat. No. 3,806,891, "Logic Circuit for Scan-In/Scan-Out"; and U.S. Pat. No. 4,493,077, "Scan Testable Integrated Circuit"). Scan architectures allow direct control of the output values of flip-flops through a device's inputs. The outputs of the flip-flops thus act as virtual inputs directly controlling the input to the combinational blocks. Scan architectures also allow the values on the inputs of the flip-flops to be easily observed from the device's outputs. In this way, the flip-flops act as virtual outputs capturing the output of the combinational blocks.

In scan architectures, a path known as a scan chain is created by reusing the functional registers present in the device. In FIG. 1, device 111 has one such scan chain that reuses flip-flops 13, 14, 17 and 18. The scan chain is accessed through a scan input 116. The output of the scan chain is sampled at a scan output 119. Scan output 119 is directly driven by flip-flop 18, which is the last flip-flop in the scan chain. Internal to device 111, connections such as a connection 120 connect the output of one flip-flop to the next, to form a scan chain of flip-flops from scan input 116 to scan output 119.

Scan chains have two modes: scan shift mode and normal mode. A separate input control signal, namely a scan-enable 114, controls which mode the scan chain is in.

In scan shift mode, the registers in the scan chain form a serial shift chain where the output of each register is the input of the next register in the scan chain. The application of a clock pulse to the scan chain in scan-shift mode will result in the shift of values by one place towards the end of the scan chain. For example, in scan shift mode, flip-flop 13 will capture the value on scan input 116 when the clock 113 is pulsed. At the same time, flip-flop 14 will capture the previous output of flip-flop 13, and so on, until the end of the scan chain.

In normal mode, the input of each register is the output of the functional combinational logic. The application of a clock pulse to the registers of the scan chain will result in the registers capturing the output value of the functional combinational logic at their input. For example, in normal mode, flip-flop 13 will capture the output of combinational logic block 11 via a connection 121.

In the prior art described above, the number of scan inputs is equal to the number of scan outputs. Modified scan architectures exist in which the number of scan chains internal to the device is greater than the number of primary inputs or outputs used for the purpose of scan-in and scan-out. The connection of the primary inputs and outputs to the internal scan chains is through an expander and compressor, respectively. The expander and compressor circuits may be of a combinational or sequential nature. Some examples of such architectures are the so-called Illinois scan architecture (see I. Hamzaoglu and J. Patel, "Reducing test application time for full scan embedded cores", IEEE International Symposium on Fault Tolerant Computing, pp. 260-267, 1999; and U.S. Pat. No. 6,708,305 "Deterministic random LBIST"). Regardless of the variation of scan architecture used, the scan chains have two modes of operation: scan shift mode and normal mode.

Figure 2:
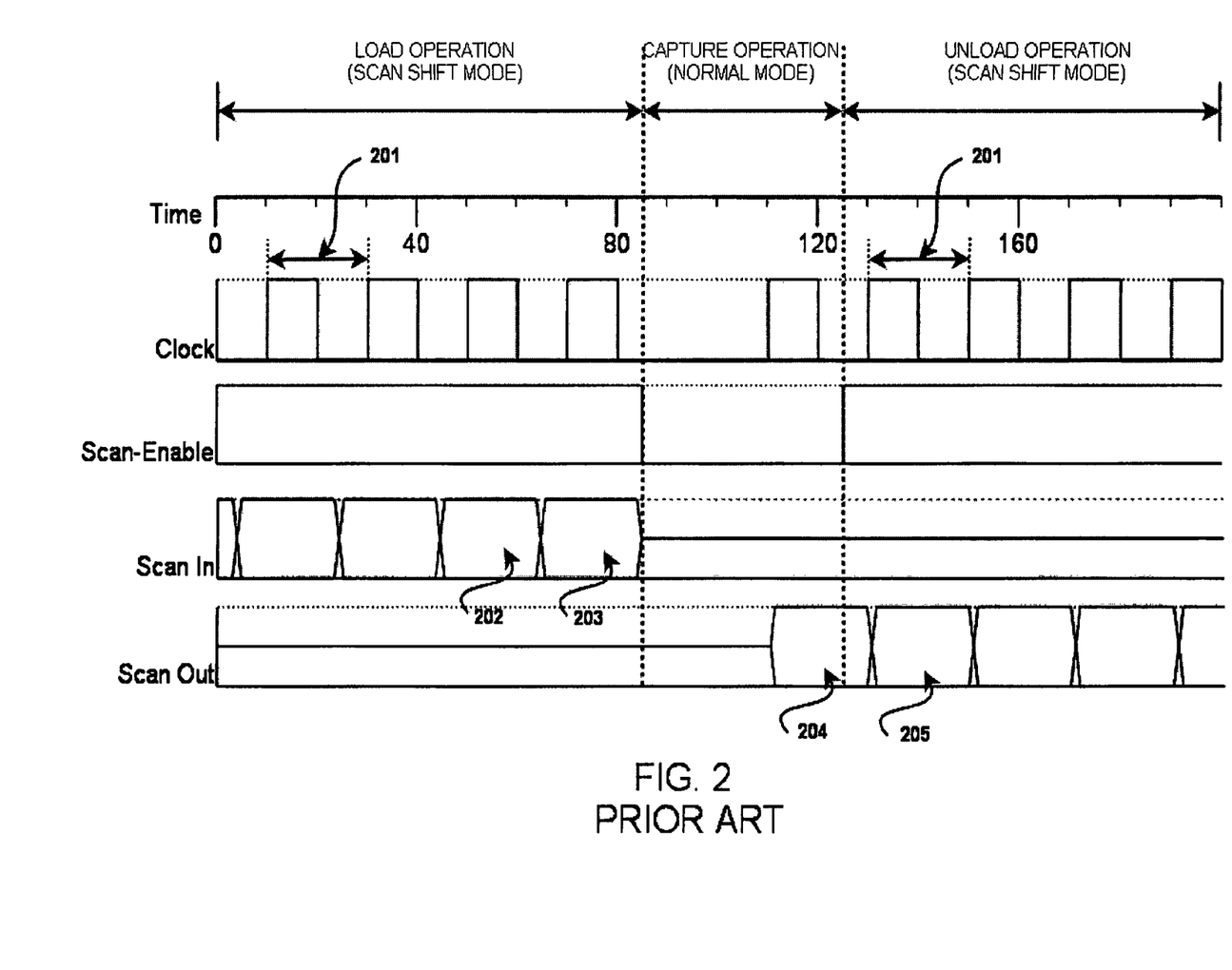
FIG. 2 is a timing diagram of an application of a test pattern.

FIG. 2 is a timing diagram of an application of a test pattern. Test patterns utilize the two modes of scan chain operation to test the device. A clock has a period 201 that is constant in shift mode, and the inverse of period 201 is referred to as the scan shift frequency. In what is referred to as a load operation, in scan shift mode, input test values 202 and 203 are shifted into the scan chain via the scan input. The response of the functional combinational logic to the input values shifted into the scan chain is captured by clocking the registers of the scan chain, in normal mode, for one cycle. This operation is referred to as capture or scan capture. The response thus captured in the scan chain is shifted out in scan shift mode as data 204 and 205, and compared against expected values at the scan output. This operation is usually referred to as the unload operation.

A test pattern that performs a single load, capture and unload operation is referred to as a scan pattern. A load or unload operation can be described in terms of two independent variables. The first variable is the scan shift period, i.e., period 201. The second variable is the scan input data, i.e., input test values 202 and 203 and the corresponding expected data 204 and 205.

A scan pattern applied at one shift frequency is just as effective at any other shift frequency, given that the scan input and expected output data set is the same. The effectiveness of a pattern is measured by its ability to detect defects in the functional logic blocks. The defects are detected only by the capture operation when the response of the functional logic to known stimulus is captured and subsequently compared. The load and unload operations do not operate upon the data, but merely transfer data in and out of the device. Therefore, the stimulus data held in the registers prior to capture, and the response captured in the registers during capture, are the same regardless of the shift frequency used to load these registers or unload the response. It is thus possible to vary the scan shift period or scan shift frequency and yet maintain the effectiveness of the scan pattern.

One scan pattern is usually insufficient to test the device in its entirety. A set of scan patterns are created such that each scan pattern tests only a portion of the device but, when all scan patterns are applied to the device, the device is fully tested. Such an approach is detailed in U.S. Pat. No. 4,534,028, "Random Testing Using Scan Path Technique". Since the manual creation of scan pattern sets is both tedious and error-prone, automated test pattern generation (ATPG) tools are used to create the scan pattern set. Test pattern generators will generate input scan patterns and expected output values based on a simulation of a fault-free software model of the device (see U.S. Pat. No. 4,601,032, "Test-Generation System for Digital Circuits"). ATPG tools generate patterns to detect many manner of faults that might be present in the device (see "Essentials of Electronic Testing for Digital, Memory and Mixed-Signal VLSI Circuits", Michael Bushnell and Vishwani Agrawal, Kluwer Academic Publishers, ISBN 0792379918, 2002, pp. 60-69). While the capture operation and scan pattern data content may vary with change in fault models, the timing of the load and unload operations are retained unchanged.

Since data is shifted by one place for every clock pulse in scan shift mode, load and unload operations require as many clock cycles as the length of the scan chain in order to fully load the input values into the chain or fully unload the response values out of the chain. Scan capture, however, is usually restricted to a single clock cycle. Since the length of the scan chains is usually much greater than one, the time required for load and unload operations dominate the test time associated with the application of a scan pattern. To save time spent in loading and unloading, the load of one scan pattern is overlapped with the unload operation of another scan pattern to form what is referred to as a load-unload operation. Thus, an ordered scan pattern set is created where the unload of a pattern is overlapped with the load of the next pattern, all the way from the load of the first scan pattern to the unload of last scan pattern.

Figure 3:
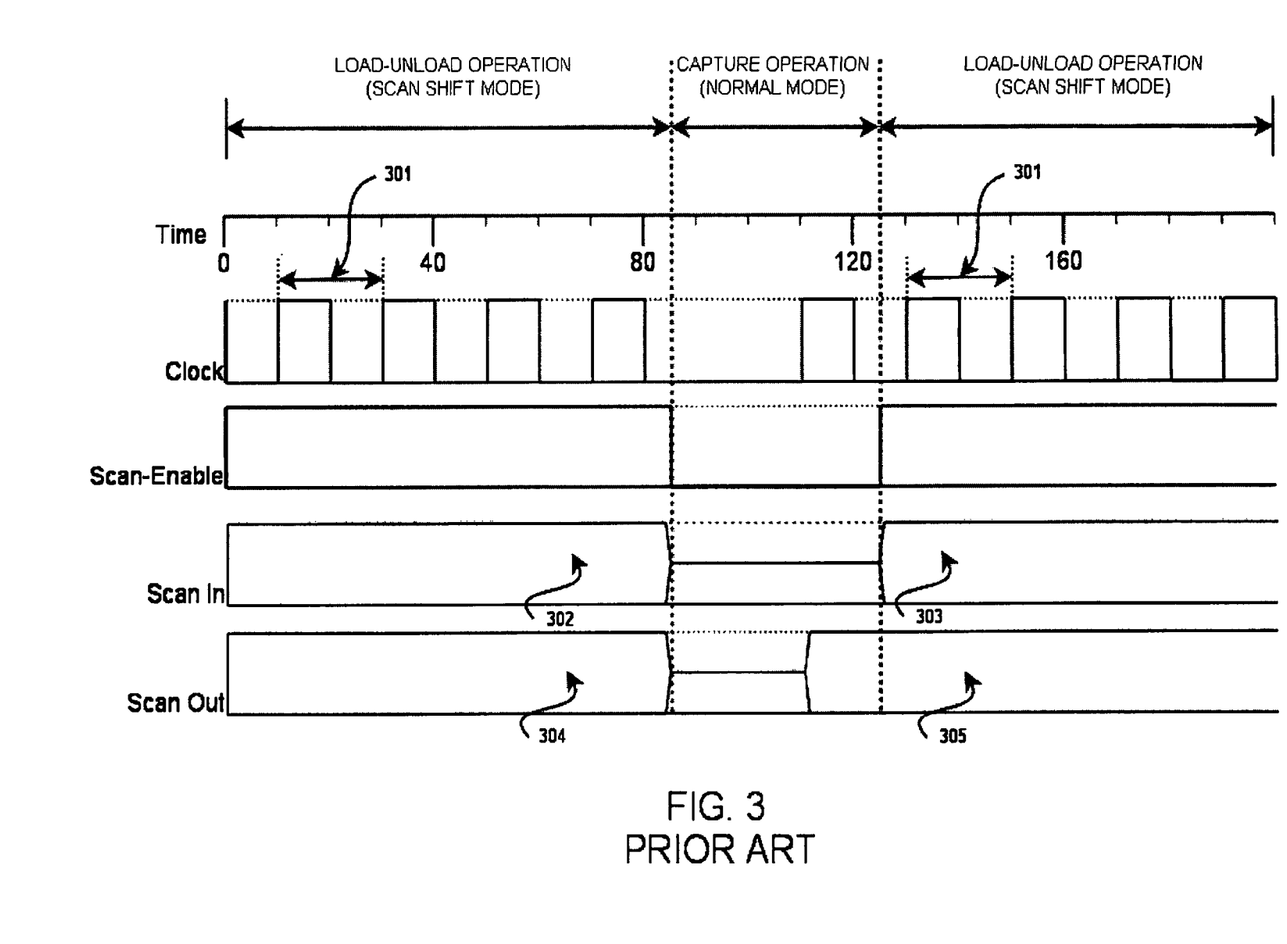
FIG. 3 is a timing diagram that shows the overlap of load and unload for consecutive scan patterns.

FIG. 3 is a timing diagram that shows the overlap of load and unload for consecutive scan patterns. The load-unload operations operate at a constant scan shift period 301. The shift in of a load vector 302 is overlapped with the shift out of the previous pattern's unload vector 304, and the shift in of a load vector 303 is overlapped with the shift out of an unload vector 305. By comparing FIG. 2 and FIG. 3, it can be seen that load vector 302 and unload vector 305 form one scan pattern. Even with load-unload operations, the time spent in scan capture is insignificant in comparison to the time spent in the load-unload operation.

During both operation and test, semiconductor devices consume electrical power. This is referred to as power dissipation. Power dissipation on a device consists of two components: static power and dynamic power (see "Low-Power Digital VLSI Design: Circuits and Systems", Bellaouar, A. (Abdellatif); Springer, ISBN 0792395875, 1995, pp 129-138). The frequency of operation is the frequency of the clock input of the device, and switching activity is a measure of the rate at which logic on the device changes state. Static power dissipation is power dissipation when logic on the device is not switching. Dynamic power dissipation is power dissipated when logic on the device switches. Static power dissipation is independent of frequency of operation. Dynamic power dissipation is proportional to both switching activity and frequency of operation.

Power dissipation beyond the rated capacity of the device is characterized by high die temperatures and excessive average and/or instantaneous supply currents. High temperatures can cause thermal damage to the device. Drawing excessive current can lower on-die voltages, referred to as IR drop, leading to failure of operation. Usually, the designers of the device attempt to ensure that both the heat dissipation capacity and the power network on the device prevent high die temperatures or low on-die voltages during normal functional operation. This is done by estimating the power dissipation incurred during functional operation, using power estimation tools (see U.S. Pat. No. 5,696,694, "Method and Apparatus for Estimating Internal Power Consumption of an Electronic Circuit Represented as Netlist"; and U.S. Pat. No. 5,668,732, "Method for Estimating Power Consumption of a Cyclic Sequential Electronic Circuit") and designing the device to operate safely at that power.

In scan shift mode, all registers in the design and the functional combinational logic connected to the output of these registers are active. The shift of values through the registers of the scan chain during the load-unload operations can cause switching of the registers as well as the logic the registers drive. The load-unload operation could lead to switching activity much higher than switching activity during functional operation. Since most of the time of a test is spent in load-unload operations, there is a potential for very high, sustained switching activity during scan test. If scan test is performed at high frequencies, the high switching activity will cause power dissipation above the limit for which the device was designed. Thus, scan patterns are applied at low frequencies in order to limit the dynamic power dissipation during scan test, to be lower than or equal to the average power dissipation that occurs during normal device operation (see K. M. Butler et. al, "Minimizing power consumption in scan testing: pattern generation and DFT techniques", in Proc. International Test Conf. (ITC'04), pp. 355-364, 2004).

Lower power dissipation during scan testing will allow faster application of scan patterns and, therefore, result in a reduction in test time and test cost. The power dissipation for a scan pattern is dependent on the data values in the scan pattern set, the logical and physical structure of the design, and the frequency at which the scan pattern set is applied. Prior art methods that modify the data content of a scan pattern that are applied to reduce power dissipation during scan test include power-constrained test scheduling (see R. M. Chou, Kewal K. Saluja and Vishwani D. Agarwal, "Scheduling tests for VLSI systems under power constraints", IEEE Trans. VLSI, Vol. 5, Issue 2, pp. 175-185, 1997), and pattern optimization (see S. Wang and S. K. Gupta, "ATPG for heat dissipation minimization during scan testing," in Proc. ACM/IEEE Design Automation Conf., 1997, pp. 614-619). An example of prior art methods that modify the logical and/or the physical structure of a design is scan chain reordering (see S. Ghosh, S. Basu, and N. A. Touba, "Joint Minimization of Power and Area in Scan Testing by Scan Cell Reordering," in Proc. IEEE Annual Symp. on VLSI, 2003, pp. 246-249).

A method has been proposed that varies scan shift frequency to meet thermal constraints (Tafaj, E.; Rosinger, P.; Al-Hashimi, B. M.; Chakrabarty, K., "Improving thermal-safe test scheduling for core-based systems-on-chip using shift frequency scaling", Proc. IEEE Symposium on Defect and Fault Tolerance in VLSI Systems, Vol. 0, pp. 544-551). In such a method, the shift frequency is optimized such that the temperature of the device does not exceed a given constraint. The method of the thermal-safe shift frequency scaling seeks to optimize the temperature of the die citing the damaging effects of excessive die temperature on the device.

Power dissipation can be used as a constraint to limit die temperature as there exists a linear relationship between power dissipation and die temperature, (K. Skadron, M. Stan, W. Huang, S. Velusamy, K. Sankaranarayanan, and D. Tarjan, "Temperature-aware microarchitecture", International Symposium on Computer Architecture (ISCA), pages 2-13, 2003). Power dissipation is a first-order effect of device operation while die temperature is a second-order effect as a result of power dissipation. Power dissipation calculations form the first step of thermal simulations. Therefore, thermal calculations for a given die and scan patterns set require more calculations than the estimation of power dissipation.

SUMMARY OF THE INVENTION

There is provided a method that includes, (a) determining a first clock frequency for shifting a first section of a scan pattern set through a path in a digital circuit such that a first power dissipated by the digital circuit while shifting the first section does not exceed a power limit, (b) determining a second clock frequency for shifting a second section of the scan pattern set through the path such that a second power dissipated by the digital circuit while shifting the second section does not exceed the power limit, (c) shifting the first section through the path at the first clock frequency, and (d) shifting the second section through the path at the second clock frequency, where first and second clock frequencies are different from one another. There is also provided a system that performs the method.

DESCRIPTION OF THE INVENTION

While pattern data modification and design modification have well-developed prior art methods, the optimization of scan shift frequency is not attended to with the same diligence afforded to design and pattern modification. Indeed, a scan pattern set generated using prior-art methods, while optimized for power dissipation through pattern modification, is generated for and applied at a constant frequency, also referred to as the shift frequency, and all scan patterns in a scan pattern set have the same constant shift frequency. This constant shift frequency is calculated such that the power dissipation of the scan pattern set applied at this frequency does not exceed the power dissipation capacity of the device. Since the shift frequency of the scan pattern set is constant, the pattern or pattern section with the maximum power dissipation will determine the shift frequency of the entire pattern set. For convenience, this constant frequency shall be referred to as nominal shift frequency for the remainder of this document.

Since each individual scan pattern excites the device and its logic in a unique manner, the power dissipation during the application of scan patterns is not constant but varies depending on the scan pattern applied. The dynamic power dissipation during a load-unload operation or a section of the load-unload operation is dependent on the content being loaded and unloaded. Based on the values being shifted through the scan chains, the resulting switching activity and dynamic power dissipation will vary. A load-unload operation of a scan pattern that has no transitions will cause no dynamic power dissipation, whereas the load-unload operation of a scan pattern that causes transitions on every cycle will have very high dynamic power dissipation. While all scan patterns and pattern sections will have dynamic power dissipation within these two extremes, the dynamic power dissipation can vary significantly across scan patterns and sections of scan patterns. A scan pattern, or a section of a scan pattern, with dynamic power dissipation lower than the maximum dynamic power dissipation, can be shifted at a higher shift frequency than the nominal shift frequency. The bigger the difference between the power dissipation of the current pattern, section or set of patterns at the nominal shift frequency and the maximum allowed power dissipation, the higher the shift frequency of the concerned section can be increased so that the final power dissipation is equal to the maximum allowed power dissipation.

Consider a scan pattern set with 10 scan patterns created for a design with an average functional power dissipation of 2.01 Watts. The power dissipation calculated for the patterns in the scan pattern set assuming a shift frequency of 10 MHz is tabulated below, in TABLE 1.

TABLE 1

| Pattern | Shift Frequency (MHz) | Dynamic Power (W) | Leakage Power (W) | Total Power (W) |
| --- | --- | --- | --- | --- |
| 0 | 10 | 1.8 | 0.01 | 1.81 |
| 1 | 10 | 2.0 | 0.01 | 2.01 |
| 2 | 10 | 1.8 | 0.01 | 1.81 |
| 3 | 10 | 1.9 | 0.01 | 1.91 |
| 4 | 10 | 1.4 | 0.01 | 1.41 |
| 5 | 10 | 0.9 | 0.01 | 0.91 |
| 6 | 10 | 0.8 | 0.01 | 0.81 |
| 7 | 10 | 0.8 | 0.01 | 0.81 |
| 8 | 10 | 0.6 | 0.01 | 0.1 |
| 9 | 10 | 0.6 | 0.01 | 0.1 |

The full scan pattern set has a nominal shift frequency of 10 MHz since pattern 1 in TABLE 1 will violate functional power constraints if the shift frequency for the scan pattern set is increased beyond 10 MHz. However, the other patterns will not violate the functional power constraint if their shift frequencies were increased above 10 Mhz. TABLE 2, below, shows the scan shift frequency required for each these ten scan patterns to reach a power dissipation of 2.01 Watts.

TABLE 2

| Pattern | Old Shift Frequency (MHz) | Old Dynamic Power (W) | Old Leakage Power (W) | Old Total Power (W) | Target Total Power (W) | Target Dynamic Power (W) | Target Shift Frequency (MHz) |
|---|---|---|---|---|---|---|---|
| 0 | 10 | 1.8 | 0.01 | 1.81 | 2.01 | 2.0 | 11.11 |
| 1 | 10 | 2.0 | 0.01 | 2.01 | 2.01 | 2.0 | 10 |
| 2 | 10 | 1.8 | 0.01 | 1.81 | 2.01 | 2.0 | 11.11 |
| 3 | 10 | 1.9 | 0.01 | 1.91 | 2.01 | 2.0 | 10.53 |
| 4 | 10 | 1.4 | 0.01 | 1.41 | 2.01 | 2.0 | 14.29 |
| 5 | 10 | 0.9 | 0.01 | 0.91 | 2.01 | 2.0 | 22.22 |
| 6 | 10 | 0.8 | 0.01 | 0.81 | 2.01 | 2.0 | 25 |
| 7 | 10 | 0.8 | 0.01 | 0.81 | 2.01 | 2.0 | 25 |
| 8 | 10 | 0.6 | 0.01 | 0.1 | 2.01 | 2.0 | 33.33 |
| 9 | 10 | 0.6 | 0.01 | 0.1 | 2.01 | 2.0 | 33.33 |

For example, the shift frequency for pattern 0 can be scaled to a frequency of 11.11 MHz.

$$\frac{10 \text{ MHz}}{1.8 \text{ W}} = \frac{x}{2.0 \text{ W}}$$

$$x = 11.11 \text{ MHz}$$

As can be seen from TABLE 2, nine out of ten of the scan patterns can operate at a frequency greater than 10 MHz. Patterns 8 and 9, due to their low dynamic power, can operate at 33.33 MHz without damaging the device or compromising the quality of test. By changing the shift frequencies for patterns such that the power dissipation incurred by the pattern is equal to functional power dissipation, it would be possible to obtain a shorter test time without damaging the device or compromising the quality of test when compared to a scan pattern set with a single scan shift frequency.

The technique described herein uses power dissipation as a constraint for optimal shift frequency calculation. The technique allows for scan pattern sets that operate at multiple scan shift frequencies such that the power dissipation for scan patterns, subsets of scan patterns or sections of scan patterns in the scan pattern set are as close to but lesser than the average functional power dissipation of the device that is to be tested.

A use of power dissipation as the constraint is also advantageous as the final pattern set can address several factors effected by power dissipation. For example, excessive power dissipation can also result in a large IR drop in the device leading to test failures of proper devices. By using power dissipation, the optimal scan shift frequency can address die temperature, IR drop and other second-order effects.

As mentioned above, the total power dissipation incurred during load-unload operation of scan patterns consists of two components: static power and dynamic power. For a given load-unload pattern or section, static power is constant but dynamic power is directly proportional to shift frequency. If the static and dynamic power dissipation is known at a particular shift frequency, such as the nominal shift frequency, it is possible to calculate the dynamic and static power dissipation at any other shift frequency. The static power is constant for both frequencies but the dynamic power at nominal shift frequency is scaled by the ratio of the new shift frequency to the nominal shift frequency. Given the static power and dynamic power calculated at a nominal shift frequency, a new shift frequency can be found for the load-unload pattern such that the power dissipation at the new shift frequency is equal to average functional power dissipation.

Figure 4:
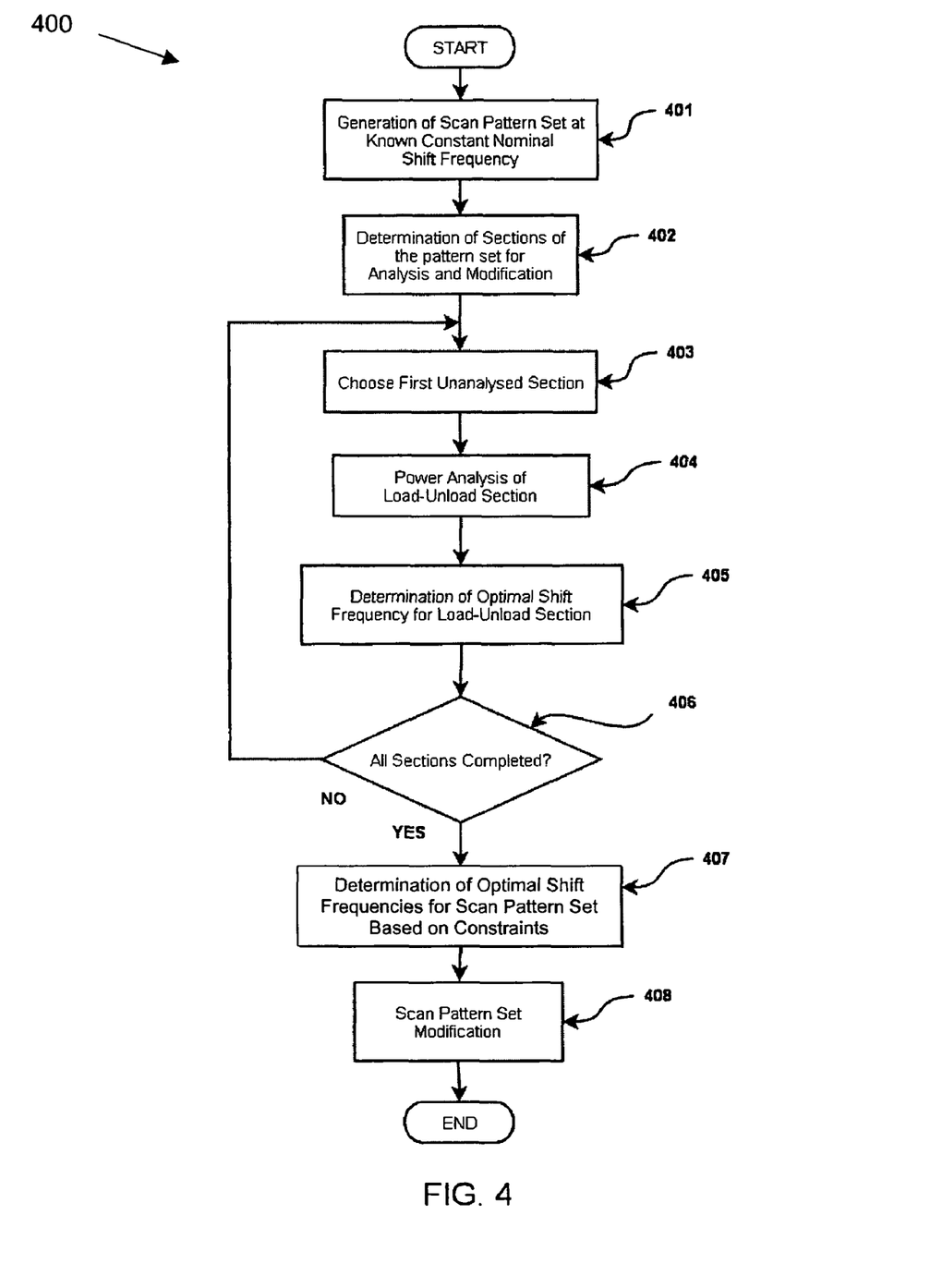
FIG. 4 is a flowchart of a method that determines an optimized shift frequency for a scan pattern set for testing a digital circuit, and also modifies the scan pattern set to use the optimized shift frequency to further advantage.

FIG. 4 is a flowchart of a method 400 that determines an optimized shift frequency for a scan pattern set for testing a digital circuit, and also modifies the scan pattern set to use the optimized shift frequency to further advantage. Method 400 commences with step 401.

In step 401, scan pattern sets are generated for the device for a known nominal shift frequency. Since the quality of test using scan patterns is independent of the shift frequency used to load values into the scan chains, the shift frequency optimization can be performed after the generation of scan patterns. From step 401, method 400 progresses to step 402.

In step 402, the scan patterns set is partitioned into one or more sections. The sections can be of any size from a single shift period to a section spanning multiple load-unload operations. That is, the full scan pattern set may be regarded as a single section, or it may be partitioned into a plurality of sections. Smaller sections allow a finer level of frequency optimization at a cost of higher run time. Larger sections are less optimal but have the advantage of lower run time. The choice of the section size will be driven by the above considerations. It is important to note that only a single new shift frequency for a given section is calculated based on the average dynamic and static power dissipation incurred by the section. While the shift frequency may be different across sections after method 400 is executed, the shift frequency within a section will be constant. Based on the size of sections, the scan pattern set is split into non-overlapping sections.

Figure 5:
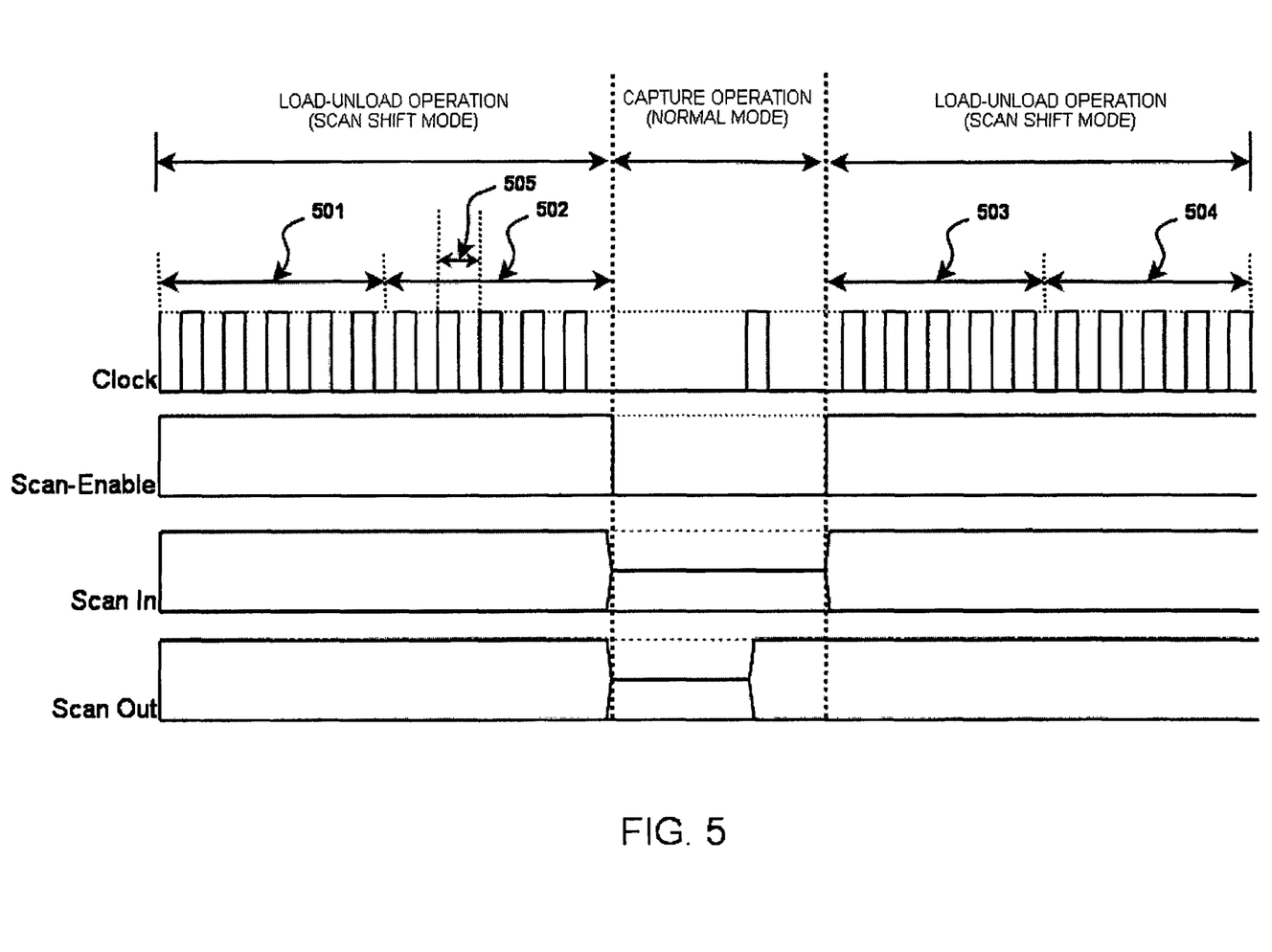
FIG. 5 is a timing diagram of a scan pattern set prior to modification.

FIG. 5 is a timing diagram of the scan pattern set prior to modification. In FIG. 5, each load-unload consists of ten shift cycles. Both load-unload operations shift at a time period 505. Using a section size of five shift cycles for the purpose of analysis, the two load-unload operations in FIG. 5 are split into the four sections 501, 502, 503 and 504.

Referring again to FIG. 4, note that method 400 includes steps 403, 404, 405 and 406 configured in a processing loop. In this processing loop, as explained in greater detail below, the scan pattern sets are analyzed as non-overlapping sections, e.g., sections 501, 502, 503 and 504. Accordingly, from step 402, method 400 progresses to step 403.

In step 403, an unanalyzed section is chosen for analysis. For example, in a first pass through the processing loop, the first section, e.g., section 501, is analyzed. From step 403, method 400 progresses to step 404.

In step 404, for the section chosen in step 403, the average dynamic and static power dissipation are estimated at the nominal shift frequency, using power estimation methods. From step 404, method 400 progresses to step 405.

In step 405, given the dynamic power dissipation at the nominal shift frequency from step 404, method 400 can estimate dynamic power dissipated by the digital circuit as a function of clock frequency. Accordingly, in step 405, method 400 determines the optimal shift frequency for the section under analysis, such that the average power dissipation at the optimal shift frequency for the section is equal to a maximum allowable functional average power dissipation. In other words, the optimal shift frequency is the frequency at which the power dissipated by the digital circuit, while shifting the section through the scan chain, does not exceed the maximum allowable functional average power dissipation. From step 405, method 400 progresses to step 406.

In step 406, method 400 considers whether all of the sections have been analyzed. If all of the sections have not yet been analyzed, from step 406, method 400 loops back to step 403, and steps 403, 404, and 405 are repeated for all defined sections of the pattern set until the condition in step 406 is satisfied. If all of the sections have been analyzed, method 400 progresses from step 406 to step 407.

For each of sections 502, 503 and 504, method 400 loops back from step 406 to step 403. Thus, for each of sections 501, 502, 503 and 504, method 400 determines a respective optimal clock frequency for shifting the subject section through the scan chain.

At the time of the progression from step 406 to step 407, the optimal shift frequency for each analyzed section is known. The output scan pattern set will reflect these calculated optimal shift frequencies, and when testing the digital circuit, each of sections 501, 502, 503 and 504 will be shifted, at its respective optimal frequency, through the scan chain. However, in practice, the equipment for conducting the test may be limited with respect to the number of discrete shift frequencies it can support. Accordingly, method 400, as it progresses to step 407, considers this limitation.

In step 407, method 400 calculates the optimal set of shift frequencies for the entire scan pattern set, subject to the constraints of the test equipment. A cost function is employed to determine the scan shift frequencies to be used such that the test application time of the scan pattern set as a whole is minimized. From step 407, method 400 progresses to step 408.

In step 408, an output scan pattern set is created using the scan shift frequency set calculated in step 407. Each load-unload operation, set of adjacent load-unload operations or a section of a single load-unload operation of a complete scan pattern set is performed at a shift frequency chosen such that the power dissipation during the corresponding load-unload operation, set of adjacent load-unload operations or section of a single load-unload operation is as high as possible but less than or equal to the average power dissipation incurred during functional operation. Thus, upon completion of step 408, the shift frequency of the output scan pattern set is fully optimized based on power dissipation.

Figure 6:
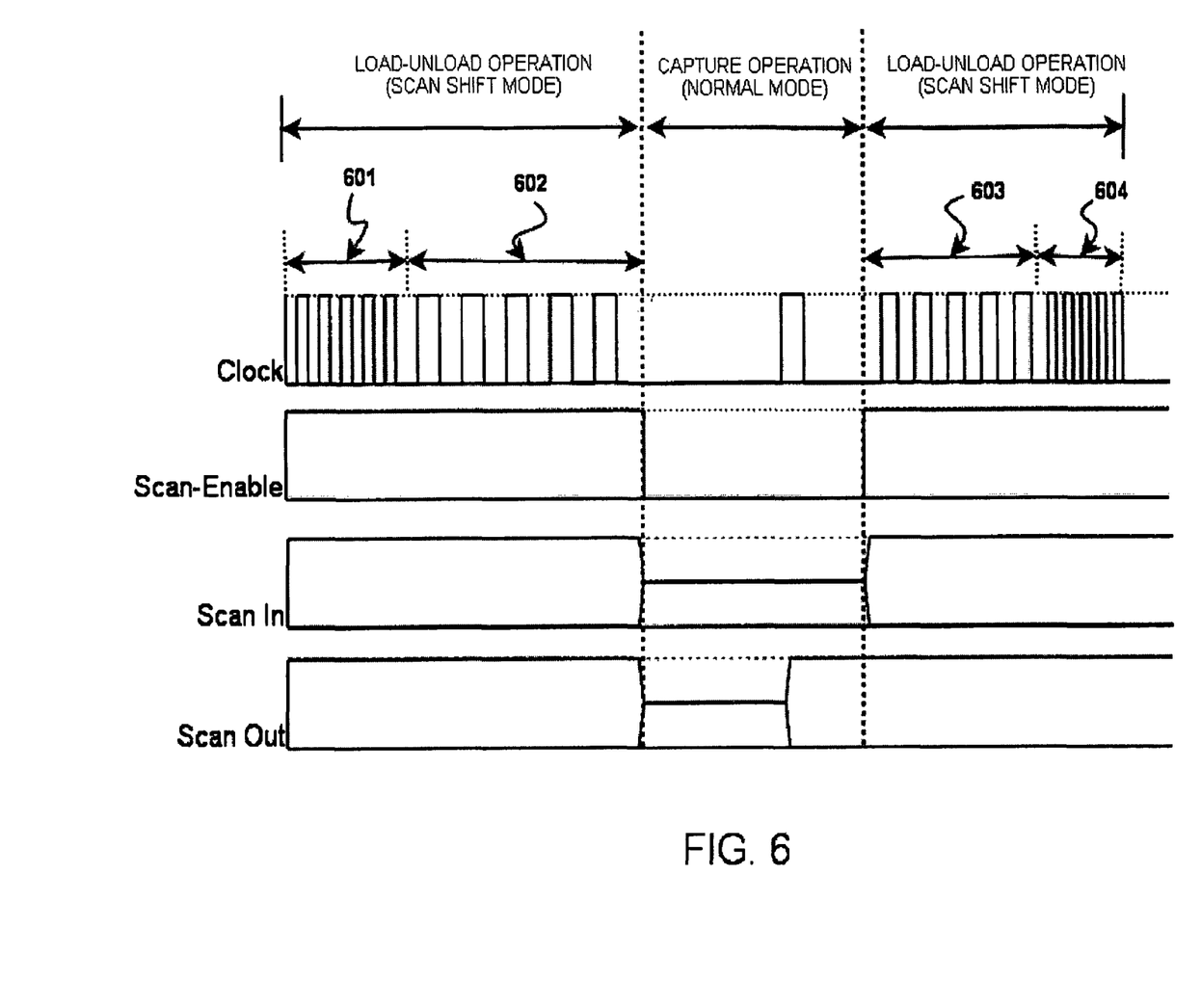
FIG. 6 is a timing diagram of the scan pattern set after the execution of the method shown in FIG. 4.

FIG. 6 is a timing diagram of the scan pattern set after the execution of method 400. In FIG. 6, there is shown a plurality of load-unload sections. Each of load-unload sections 601, 602, 603 and 604 uses an optimal shift frequency based on the frequency calculated in step 405 for the load-unload sections 501, 502, 503 and 504, respectively, of FIG. 5. The number of shift cycles for each section 601, 602, 603 and 604 is still five cycles, as it is for sections 501, 502, 503 and 504, and the shift frequency is constant within each section 601, 602, 603 and 604.

The application of the scan pattern set as shown in FIG. 6 is as effective as the application of the scan pattern as shown in FIG. 5 as the load-unload data set is unchanged. However, the test application time for FIG. 6, is reduced as compared to FIG. 5, as sections 601, 603 and 604 run at a higher frequency than the frequency of sections 501, 503 and 504. Method 400, through the optimization of the scan pattern set of FIG. 5, to produce the scan pattern set of FIG. 6, reduces the test application time without compromising the effectiveness of the scan pattern set.

Figure 7:
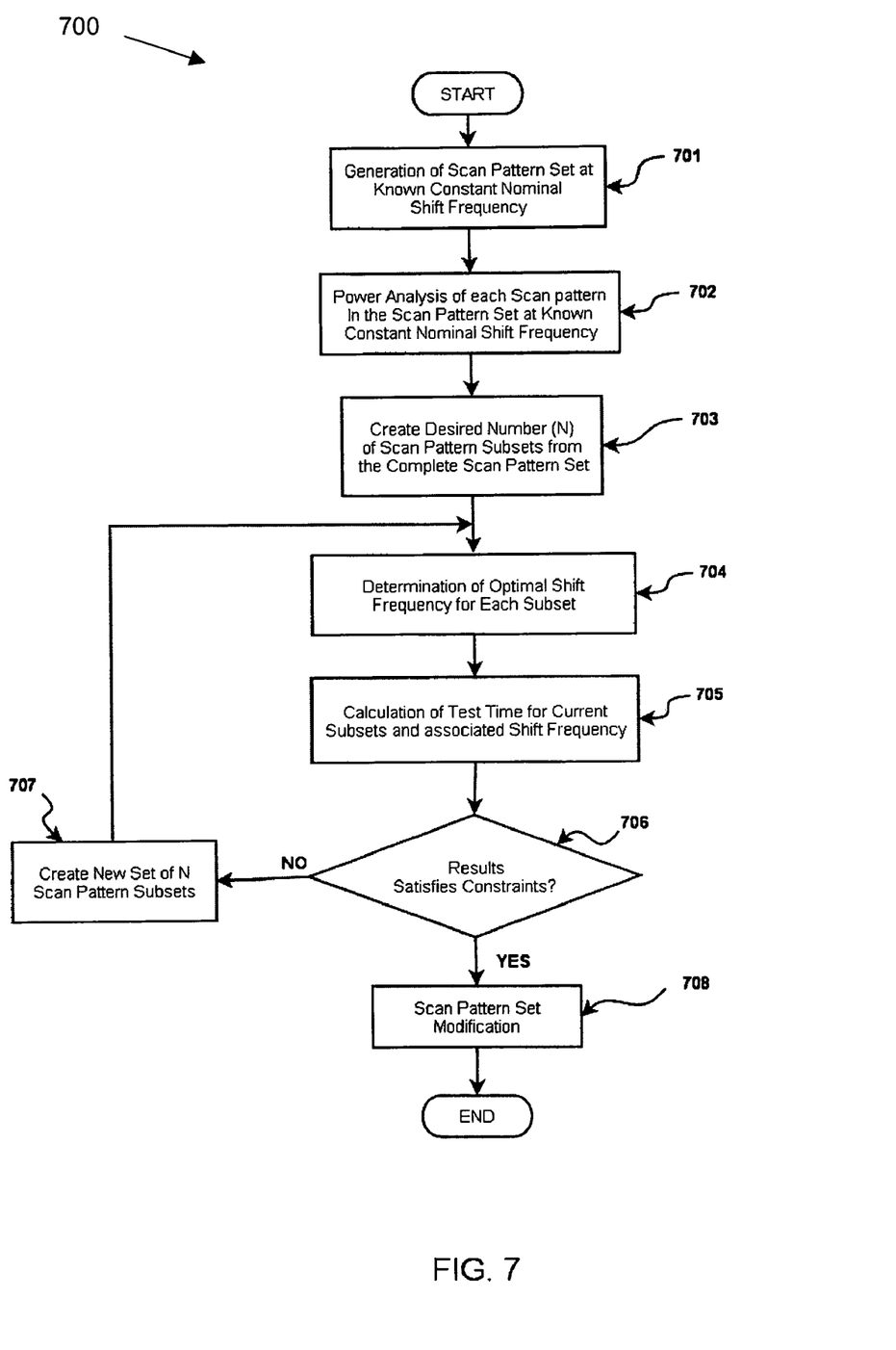
FIG. 7 is a flowchart of a method that determines an optimized shift frequency for a scan pattern set for testing a digital circuit, and also modifies the scan pattern set to use the optimized shift frequency to further advantage.

FIG. 7 is a flowchart of a method 700 that determines an optimized shift frequency for a scan pattern set for testing a digital circuit, and also modifies the scan pattern set to use the optimized shift frequency to further advantage. In method 700, the original complete scan pattern set is split into multiple independent scan pattern subsets that are applied at a shift frequency chosen such that the power dissipation during the application of the scan pattern subset does not exceed the average functional power dissipation incurred during functional operation. The scan shift frequency is constant within the scan pattern subsets but will vary across scan pattern subsets. The number of scan pattern subsets, and the scan patterns within each scan pattern subset, are calculated to satisfy test application time constraints. Method 700 commences with step 701.

In step 701, scan pattern sets are generated for the device for a known nominal shift frequency. From step 701, method 700 progresses to step 702.

In step 702, the average dynamic power dissipation and static power dissipation of each load-unload section in the scan pattern set is estimated for the nominal shift frequency. Since the quality of test using scan patterns is independent of the shift frequency used to load values into the scan chains, the shift frequency optimization can be performed after the generation of scan patterns. From step 702, method 700 progresses to step 703.

In step 703, based on requirements or imposed constraints on the number of scan pattern subsets, the original scan pattern set is either considered in whole, i.e., a single subset, or split into a number of independent and non-overlapping scan pattern subsets. There is no requirement that these scan pattern subsets be of equal size. From step 703, method 700 progresses to step 704.

In step 704, method 700, using the static and dynamic power components calculated for each scan pattern in step 702, determines the optimal shift frequency for each scan pattern subset created in step 703. Since dynamic power dissipation is proportional to shift frequency and the static and dynamic power dissipation is known at the nominal shift frequency, it is possible to calculate the dynamic and static power dissipation at any other shift frequency for all the scan patterns in a scan pattern subset. The static power is constant for both frequencies but the dynamic power at nominal shift frequency is scaled by the ratio of the new shift frequency to the nominal shift frequency. Given the static power and dynamic power calculated at the nominal shift frequency, a new shift frequency can be found for all the patterns in the scan pattern subset such that the power dissipation at the new shift frequency for all the patterns in the scan pattern subset is maximized but is less than or equal to average functional power dissipation. From step 704, method 700 progresses to step 705.

In step 705, given the new shift frequencies for the current set of scan pattern subsets calculated in step 704, the test time for the scan pattern subsets with their new shift frequencies will be calculated using a cost function. The cost function will take into account both the test application time of scan pattern subsets at their new shift frequencies and the time required to switch between scan pattern subsets. The time period required to switch between two scan pattern subsets of different frequencies is non-trivial for some semiconductor test equipment. From step 705, method 700 progresses to step 706.

In step 706, method 700 considers whether the current scan pattern subsets satisfy test constraints, such as test application time being below a threshold value. Step 706 may also involve other activities such as attempting to minimize an amount of time to perform the test, considering a maximum number of changes in clock frequency permitted during said test, considering a constraint associated with an operation of a test set that is employed during said test, and a combination thereof. If the current scan pattern subsets do not satisfy the test constraints, method 700 progresses to step 707. If the current scan pattern subsets satisfy the test constraints, method 700 progresses to step 708.

In step 707, a new untested set of scan pattern subsets is chosen. From step 707, method 700 loops back to step 704.

In step 708, the scan pattern set is divided and modified per the configuration calculated in step 704.

Method 700 can also be used to find the set of scan pattern subsets that gives the least possible test time for all possible scan pattern subsets. For such a requirement, all possible sets of scan pattern subsets are analyzed and the complete scan pattern set is divided and modified into the scan pattern subsets that were calculated to take the least test application time.

For example, consider a scan pattern set with ten scan patterns created in step 701 for a design with an average functional power dissipation of 2.01 Watts. The power dissipation calculated in step 702 for the patterns in the scan pattern set assuming a shift frequency of 10 MHz is tabulated in TABLE 3, below.

TABLE 3

| Pattern | Shift Frequency (MHz) | Dynamic Power (W) | Leakage Power (W) | Total Power (W) |
|---|---|---|---|---|
| 0 | 10 | 1.8 | 0.01 | 1.81 |
| 1 | 10 | 2.0 | 0.01 | 2.01 |
| 2 | 10 | 1.8 | 0.01 | 1.81 |
| 3 | 10 | 1.9 | 0.01 | 1.91 |
| 4 | 10 | 1.4 | 0.01 | 1.41 |
| 5 | 10 | 0.9 | 0.01 | 0.91 |
| 6 | 10 | 0.8 | 0.01 | 0.81 |
| 7 | 10 | 0.8 | 0.01 | 0.81 |
| 8 | 10 | 0.6 | 0.01 | 0.1 |
| 9 | 10 | 0.6 | 0.01 | 0.1 |

The full scan pattern set has a nominal shift frequency of 10 MHz since pattern 1 in TABLE 3 will violate functional power constraints if the shift frequency for the scan pattern set is increased beyond 10 MHz. In step 703, the scan pattern set is split into two subsets: A and B. Subset A consists of patterns 0, 1, 2, 3 and 4. Subset B consists of patterns 5, 6, 7, 8 and 9. The target scan shift frequency to achieve a maximum power dissipation of 2.01 Watts for all scan patterns in subsets A and B is calculated in step 704. The results of the calculation are shown in TABLE 4, below.

TABLE 4

| Subset | Pattern | Old Shift Frequency (MHz) | Old Dynamic Power (W) | Old Leakage Power (W) | Old Total Power (W) | Target Total Power (W) | Target Dynamic Power (W) | Target Shift Frequency (MHz) | Optimal Shift Frequency for Subset (MHz) |
|---|---|---|---|---|---|---|---|---|---|
| A | 0 | 10 | 1.8 | 0.01 | 1.81 | 2.01 | 2.0 | 11.11 | 10 |
|  | 1 | 10 | 2.0 | 0.01 | 2.01 | 2.01 | 2.0 | 10 |  |
|  | 2 | 10 | 1.8 | 0.01 | 1.81 | 2.01 | 2.0 | 11.11 |  |
|  | 3 | 10 | 1.9 | 0.01 | 1.91 | 2.01 | 2.0 | 10.53 |  |
|  | 4 | 10 | 1.4 | 0.01 | 1.41 | 2.01 | 2.0 | 14.29 |  |
| B | 5 | 10 | 0.9 | 0.01 | 0.91 | 2.01 | 2.0 | 22.22 | 22.22 |
|  | 6 | 10 | 0.8 | 0.01 | 0.81 | 2.01 | 2.0 | 25 |  |
|  | 7 | 10 | 0.8 | 0.01 | 0.81 | 2.01 | 2.0 | 25 |  |
|  | 8 | 10 | 0.6 | 0.01 | 0.1 | 2.01 | 2.0 | 33.33 |  |
|  | 9 | 10 | 0.6 | 0.01 | 0.1 | 2.01 | 2.0 | 33.33 |  |

The optimal shift frequency for subsets A and B is the minimum of the target shift frequencies for all the patterns in the corresponding subset. This minimum frequency is the highest frequency for which all patterns in the subset do not violate the functional power constraints. The clock frequency for each of the sections in subset A will be set to the lowest frequency of the sections of subset A, and the clock frequency for subset B will be the lowest frequency of the sections of subset B. Thus, pattern 1 limits the shift frequency of subset A to 10 MHz, and pattern 5 limits the shift frequency of subset B to 22.22 MHz.

Also, the limitation of shift frequency to a lowest frequency is particularly appropriate in a case where, during a shifting operation, sections are concurrently situated it the scan chain. For example, if patterns 0 and 1 are concurrently situated in the scan path, the shift frequency would be limited to 10 MHz, otherwise the shifting of pattern 1 would result in excessive power dissipation.

In step 705, the test application time for subset A at 10 MHz and subset B at 22.22 MHz is calculated. The test time for original scan patterns and the scan pattern subsets A and B are calculated and compared in TABLE 5, below.

TABLE 5

| Type | Number of Patterns | Shift Frequency (MHz) | Number of Clock Cycles Per Pattern | Test Time for Patterns (ms) | Total Test Time (ms) |
|---|---|---|---|---|---|
| Original | 10 | 10 | 1000 | 10 | 10 |
| Modified | 5 | 10 | 1000 | 5 | 7.25 |
|  | 5 | 22.22 | 1000 | 2.25 |  |

The modified scan pattern subsets A and B have a total test time of 7.24 milliseconds as opposed to the original scan pattern set's test time of 10 milliseconds. If this reduced test time meets the criteria checked in step 706, scan pattern subsets A and B are created to operate at 10 Mhz and 22.22 MHz, respectively, in step 708. This provides for a reduction of test time by 22.75% for the scan pattern set, without compromising on the safety of the device or the quality of test.

Each of methods 400 and 700 yield a scan pattern set that operates at a plurality of scan shift frequencies such that the power dissipation during the application of the scan pattern set is as close to but less than the average functional power dissipation for which the device is designed. The average power dissipation for which the device is designed is the highest power dissipation at which no effect of excessive power dissipation, such as die temperature or IR drop, damages the device or causes test failures of proper devices. Some patterns or sections of patterns in the scan pattern set of lower power dissipation will shift at a frequency higher than the nominal shift frequency. Since a semiconductor device is designed to handle average functional power dissipation, the power dissipation of the scan pattern set generated with a plurality of shift frequencies, as in methods 400 and 700, will reduce test application time of the scan pattern set as compared to a scan pattern set with a single shift frequency, without adversely affecting the device or quality of test.

Figure 8:
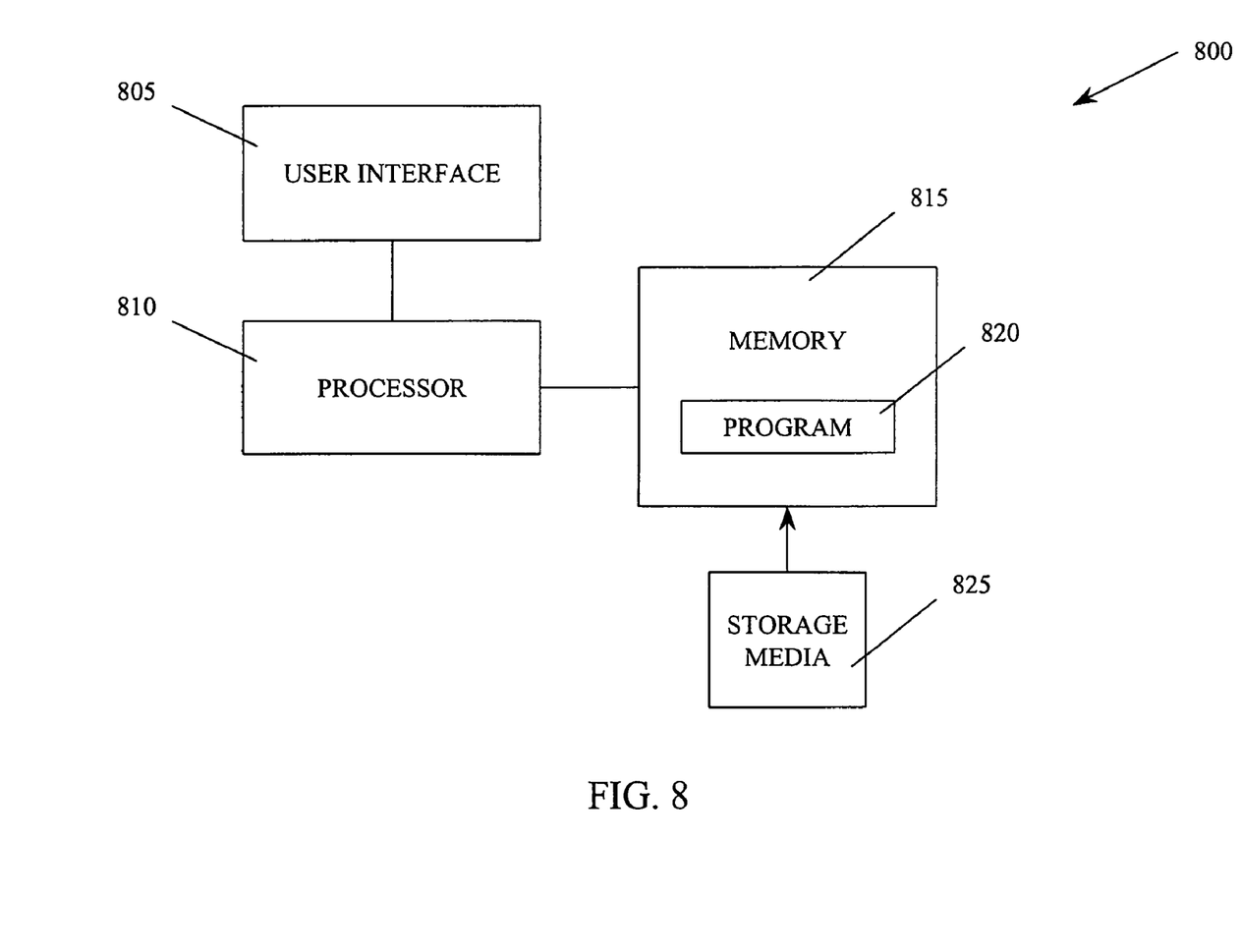
FIG. 8 is a block diagram of a system for execution of the methods of FIGS. 4 and 7.

FIG. 8 is a block diagram of a system 800 for execution of methods 400 and 700. System 800 includes a user interface 805, a processor 810, and a memory 815. System 800 may be implemented on a general-purpose microcomputer. Although system 800 is represented herein as a standalone system, it is not limited to such, but instead can be coupled to other computer systems (not shown) via a network (not shown). Accordingly, system 800 can also be coupled to a test set (not shown) for testing a digital circuit, and can control the test set to operate in accordance with methods 400 and 700.

Memory 815 stores data and instructions for controlling the operation of processor 810. An implementation of memory 815 would include a random access memory (RAM), a hard drive and a read only memory (ROM). One of the components of memory 815 is a program 820.

Program 820 includes instructions for controlling processor 810 to execute methods 400 and 700. Program 820 may be implemented as a single module or as a plurality of modules that operate in cooperation with one another. The term "module" is used herein to denote a functional operation that may be embodied either as a stand-alone component or as an integrated configuration of a plurality of sub-ordinate components.

User interface 805 includes an input device, such as a keyboard or speech recognition subsystem, for enabling a user to communicate information and command selections to processor 810. User interface 805 also includes an output device such as a display or a printer. A cursor control such as a mouse, track-ball, or joystick, allows the user to manipulate a cursor on the display for communicating additional information and command selections to processor 810.

While program 820 is indicated as already loaded into memory 815, it may be configured on a storage media 825 for subsequent loading into memory 815. Storage media 825 can be any conventional storage media such as a magnetic tape, an optical storage media, a compact disk, or a floppy disk. Alternatively, storage media 825 can be a random access memory, or other type of electronic storage, located on a remote storage system and coupled to memory 815.

Moreover, although program 820 is described herein as being installed in memory 815, and therefore being implemented in software, it could be implemented in any of hardware, firmware, software, or a combination thereof.

The techniques described herein are exemplary, and should not be construed as implying any particular limitation on the present invention. It should be understood that various alternatives, combinations and modifications could be devised by those skilled in the art. The present invention is intended to embrace all such alternatives, modifications and variances that fall within the scope of the appended claims.

What is claimed is:
1. A method comprising:
   determining a first clock frequency for shifting a first section of a scan pattern set through a path in a digital circuit such that a first power dissipated by said digital circuit while shifting said first section does not exceed a power limit;
   determining a second clock frequency for shifting a second section of said scan pattern set through said path such that a second power dissipated by said digital circuit while shifting said second section does not exceed said power limit;
   shifting said first section through said path at said first clock frequency; and
   shifting said second section through said path at said second clock frequency,
   wherein said first and second clock frequencies are different from one another.

2. The method of claim 1, wherein said first clock frequency is such that said first power is approximately equal to said power limit.

3. The method of claim 2, wherein said second clock frequency is such that said second power is approximately equal to said power limit.

4. The method of claim 1, wherein said determining said first clock frequency comprises estimating said first power as a function of clock frequency for shifting said first section through said path.

5. The method of claim 4, wherein said estimating includes estimating dynamic power dissipated by said digital circuit as a function of clock frequency for shifting said first section through said path.

6. The method of claim 1,
   wherein said scan pattern also includes a third section and a fourth section, and
   wherein said method further comprises:
       determining a third clock frequency for shifting said third section through said path such that a third power dissipated by said digital circuit while shifting said third section does not exceed said power limit;
       determining a fourth clock frequency for shifting said fourth section through said path such that a fourth power dissipated by said digital circuit while shifting said fourth section does not exceed said power limit; and
       shifting said third section through said path at a clock frequency that is a lower of said third clock frequency and said fourth clock frequency.

7. The method of claim 6, wherein said third and fourth sections are arranged in said scan pattern set such that said third section and said fourth section will be concurrently situated in said path.

8. The method of claim 1,
   wherein said scan pattern also includes a third section, and
   wherein said method further comprises:
       determining a third clock frequency for shifting said third section through said path such that a third power dissipated by said digital circuit while shifting said third section does not exceed said power limit;
       determining a difference between an amount of time required to shift said third section through said path at said third clock frequency, and an amount of time required to shift said third section through said path at a nominal clock frequency; and
       either (a) shifting said third section through said path at said third clock frequency, if said difference is greater than a threshold value, or (b) shifting said third section through said path at said nominal clock frequency, if said difference is less than said threshold value.

9. The method of claim 1,
wherein said scan pattern set also includes a third section, and
wherein said method further comprises:
  determining a third clock frequency for said shifting said third section through said path such that a third power dissipated by said digital circuit while shifting said third section does not exceed said power limit; and
  deciding, for a test of said digital circuit, whether to shift said third section through said path using said third clock frequency or using another clock frequency,
  wherein said deciding includes an activity selected from the group consisting of:
    (a) attempting to minimize an amount of time to perform said test;
    (b) considering a maximum number of changes in clock frequency permitted during said test;
    (c) considering a constraint associated with an operation of a test set that is employed during said test; and
    (d) a combination thereof.

10. A system comprising a module that performs a method that includes:
  determining a first clock frequency for shifting a first section of a scan pattern set through a path in a digital circuit such that a first power dissipated by said digital circuit while shifting said first section does not exceed a power limit;
  determining a second clock frequency for shifting a second section of said scan pattern set through said path such that a second power dissipated by said digital circuit while shifting said second section does not exceed said power limit;
  shifting said first section through said path at said first clock frequency; and
  shifting said second section through said path at said second clock frequency,
  wherein said first and second clock frequencies are different from one another.

11. The system of claim 10, wherein said first clock frequency is such that said first power is approximately equal to said power limit.

12. The system of claim 11, wherein said second clock frequency is such that said second power is approximately equal to said power limit.

13. The system of claim 10, wherein said determining said first clock frequency comprises estimating said first power as a function of clock frequency for shifting said first section through said path.

14. The system of claim 13, wherein said estimating includes estimating dynamic power dissipated by said digital circuit as a function of clock frequency for shifting said first section through said path.

15. The system of claim 10,
wherein said scan pattern set also includes a third section, and
wherein said method also includes:
  determining a third clock frequency for said shifting said third section through said path such that a third power dissipated by said digital circuit while shifting said third section does not exceed said power limit; and
  deciding, for a test of said digital circuit, whether to shift said third section through said path using said third clock frequency or using another clock frequency,
  wherein said deciding includes an activity selected from the group consisting of:
    (a) attempting to minimize an amount of time to perform said test;
    (b) considering a maximum number of changes in clock frequency permitted during said test;
    (c) considering a constraint associated with an operation of a test set that is employed during said test; and
    (d) a combination thereof.

16. A storage medium comprising a program encoded thereon that is executable in a processor to perform a method that includes:
  determining a first clock frequency for shifting a first section of a scan pattern set through a path in a digital circuit such that a first power dissipated by said digital circuit while shifting said first section does not exceed a power limit;
  determining a second clock frequency for shifting a second section of said scan pattern set through said path such that a second power dissipated by said digital circuit while shifting said second section does not exceed said power limit;
  shifting said first section through said path at said first clock frequency; and
  shifting said second section through said path at said second clock frequency,
  wherein said first and second clock frequencies are different from one another.

17. The storage media of claim 16, wherein said first clock frequency is such that said first power is approximately equal to said power limit.

18. The storage media of claim 17, wherein said second clock frequency is such that said second power is approximately equal to said power limit.

19. The storage media of claim 16, wherein said determining said first clock frequency comprises estimating said first power as a function of clock frequency for shifting said first section through said path.

20. The storage media of claim 19, wherein said estimating includes estimating dynamic power dissipated by said digital circuit as a function of clock frequency for shifting said first section through said path.

21. The storage media of claim 16,
wherein said scan pattern set also includes a third section, and
wherein said method also includes:
  determining a third clock frequency for said shifting said third section through said path such that a third power dissipated by said digital circuit while shifting said third section does not exceed said power limit; and
  deciding, for a test of said digital circuit, whether to shift said third section through said path using said third clock frequency or using another clock frequency,
  wherein said deciding includes an activity selected from the group consisting of:
    (a) attempting to minimize an amount of time to perform said test;
    (b) considering a maximum number of changes in clock frequency permitted during said test;
    (c) considering a constraint associated with an operation of a test set that is employed during said test; and
    (d) a combination thereof.

* * * * *